US012777964B2

(12) United States Patent
Herard et al.

(10) Patent No.: US 12,777,964 B2
(45) Date of Patent: Oct. 27, 2026

(54) METHOD FOR MANUFACTURING SEVERAL INTEGRATED CIRCUIT PACKAGES

(71) Applicant: STMicroelectronics International N.V., Plan-les-Ouates (CH)

(72) Inventors: Laurent Herard, Sainte Foy les Lyon (FR); Olivier Zanellato, Chambery (FR); Patrick Laurent, Tullins (FR)

(73) Assignee: STMicroelectronics International N.V., Geneva (CH)

( * ) Notice: Subject to any disclaimer, the term of this patent is extended or adjusted under 35 U.S.C. 154(b) by 421 days.

(21) Appl. No.: 18/529,064

(22) Filed: Dec. 5, 2023

(65) Prior Publication Data

US 2024/0186195 A1 Jun. 6, 2024

(30) Foreign Application Priority Data

Dec. 6, 2022 (FR) ...................................... 2212804

(51) Int. Cl.
*H10W 76/60* (2026.01)
*H10W 70/05* (2026.01)
(Continued)

(52) U.S. Cl.
CPC ........... *H10W 76/60* (2026.01); *H10W 70/05* (2026.01); *H10W 72/071* (2026.01); (Continued)

(58) Field of Classification Search
CPC ... H10W 76/60; H10W 70/05; H10W 72/071; H10W 76/15; H10W 90/701; H10W 72/0198; H10W 95/00; H10W 99/00; H10W 70/68; H10W 72/20; H10W 74/01; H10P 54/00
See application file for complete search history.

(56) References Cited

U.S. PATENT DOCUMENTS 7,473,583 B1 1/2009 Nagarajan
2002/0027296 A1* 3/2002 Badehi .................. B81B 7/0067 257/782
(Continued)

FOREIGN PATENT DOCUMENTS

CN 105632911 A 6/2016

OTHER PUBLICATIONS

INPI Search Report and Written Opinion for FR 2212804, report dated Oct. 24, 2023, 11 pgs.

*Primary Examiner* — Andres Munoz
(74) *Attorney, Agent, or Firm* — Crowe & Dunlevy LLC

(57) ABSTRACT

An integrated circuit package includes a support substrate having a mounting face and a lateral wall having an inner face and an outer face. The inner face delimits with the mounting face a cavity. The outer face includes a step extending outwardly of the package. An electronic chip disposed in the cavity and electrically connected to electrically-conductive contact pads. A sealing structure is bonded by a glue to an upper face of the lateral wall to seal the cavity. The glue does not spill out over the outer face of the lateral wall. Electrically-conductive connection elements are located over a lower face of the support substrate and electrically cooperate with the contact pads through an interconnection network located in the support substrate.

15 Claims, 2 Drawing Sheets

(51) Int. Cl.

| | |
|---|---|
| ***H10W 72/00*** | (2026.01) |
| ***H10W 76/15*** | (2026.01) |
| ***H10W 90/00*** | (2026.01) |

(52) U.S. Cl.

CPC ......... *H10W 76/15* (2026.01); *H10W 90/701* (2026.01); *H10W 72/0198* (2026.01)

(56) References Cited

U.S. PATENT DOCUMENTS

| | | | | |
|---|---|---|---|---|
| 2005/0037538 | A1* | 2/2005 | Minamio | H10F 39/804 257/E31.118 |
| 2005/0044618 | A1* | 3/2005 | Shimizu | H10F 39/804 257/E31.118 |
| 2005/0161755 | A1* | 7/2005 | Huang | H10F 39/804 257/E31.117 |
| 2007/0190691 | A1 | 8/2007 | Humpston et al. | |
| 2010/0200983 | A1* | 8/2010 | Ono | H05K 3/341 257/E23.181 |
| 2011/0127655 | A1* | 6/2011 | Fujii | H10W 40/228 257/664 |
| 2014/0203424 | A1 | 7/2014 | Shimanouchi | |
| 2018/0190511 | A1* | 7/2018 | Mas | H10W 20/40 |
| 2022/0102591 | A1* | 3/2022 | Zanellato | H10F 39/804 |
| 2024/0136376 | A1* | 4/2024 | Wu | H10F 39/804 |

* cited by examiner

METHOD FOR MANUFACTURING SEVERAL INTEGRATED CIRCUIT PACKAGES

PRIORITY CLAIM

This application claims the priority benefit of French Application for Patent No. 2212804, filed on Dec. 6, 2022, the content of which is hereby incorporated by reference in its entirety to the maximum extent allowable by law.

TECHNICAL FIELD

Embodiments and implementations relate to the field of electronics and, in particular, to the field of packaging of integrated circuits and more particularly to the manufacture of several integrated circuit packages.

BACKGROUND

The manufacture of integrated circuit packages may be carried out starting from a support plate or substrate, for example, yet without limitation, of the laminate substrate type over which the packages could be made before individualization thereof by cutting of the support plate.

The packages may be distributed in rows and columns, in dedicated locations separated from one another by a wall which, after cutting, will form a lateral wall for each individual package.

This wall delimits for each location, a cavity where the different elements of the corresponding package are mounted, such as an electronic integrated circuit chip and a structure for sealing the corresponding cavity, for example an optically-transparent sealing element such as a glass in the case of an optical package. In particular, the sealing structure is typically attached, for example by means of a glue, over the lateral wall of each package.

Before cutting, the wall projecting from the plate may also be used to attach several sealing structures associated to packages respectively assembled in adjacent locations.

The wall is then wide enough to enable attachment of the sealing structures but narrow enough to enable bringing the package locations close to one another, so as to be able to manufacture a larger amount of packages over the plate.

Nevertheless, a problem arises when the sealing structure is bonded on the wall before cutting of the wall.

Indeed, an excessively thin wall does not allow spacing the sealing structures apart from each other enough so that, when the sealing structures are pressed on the wall with the glue between the wall and the end of the sealing structure, glue spills out into the cutting areas of the wall.

And the presence of glue in the cutting areas produces defects on the edges of each package, such as burrs, in particular when the glue being used has mechanical properties different from the material of the wall, these burrs resulting from a peel-off of the glue located in the cutting areas when cutting the wall.

Indeed, the cut is typically preceded by a step of cross-linking the glue allowing creating chemical bonds between the sealing structure and the wall.

After formation of these chemical bonds, the glue may feature some elasticity.

Because of its elasticity, the glue could then be peeled off during cutting of the wall and weaken the sealing structures of the respective packages.

Moreover, once individualized, the packages may feature traces of peeled off glue along their respective lateral wall.

In this respect, it may be provided to form a wider wall so as to keep the sealing structure away from the different cutting areas in order to prevent glue from the spilling out into these when attaching the sealing structures.

Nonetheless, by increasing the width of the walls formed over the plate, the width of the lateral walls of the packages after individualization thereof is also increased, thereby making the integrated circuit packages less compact.

Consequently, in particular, there is a need to provide a solution allowing avoiding a peel-off of the glue during the individualization of the packages while obtaining compact packages.

SUMMARY

According to one aspect, a method for manufacturing several integrated circuit packages comprises: providing a support substrate having a mounting face and comprising a wall projecting over the mounting face and delimiting with the mounting face an array of cavities, each cavity including electrically-conductive contact pads over the mounting face, the support substrate including under each cavity an interconnection network between the contact pads and a lower face of the support substrate; forming first trenches extending partially in the wall around each cavity; mounting electronic integrated circuit chips on the mounting face of the support substrate respectively in said cavities and electrically cooperating with the corresponding contact pads; sealing the cavities by gluing respective sealing structures over an upper face of the wall between the first trenches using a glue that is configured so as not to spill out into the first trenches, so as to obtain an array of packages; forming electrically-conductive connection elements under each cavity electrically cooperating with the corresponding interconnection network; and individualizing the packages by cutting said wall and the support substrate to form, in said wall and in the support substrate, second trenches that are thinner than the first trenches and which extend the first trenches through to the lower face of the support substrate.

Thus, it is provided to make first trenches, for example thanks to a partial cutting of the wall in the cutting areas, so that the wall has, after this partial cutting, a “U”-like shape. The “U”-like shape of the wall as well as the characteristics of the glue, for example the surface tension, contribute in preventing the glue located on either side of the first trenches from spilling out into the first trenches, in particular into the cutting areas, during sealing of the cavities by the respective sealing structure.

Moreover, it is advantageously possible to carry out a partial wetting of the upper face of the wall by the glue so that the glue does not spill out into the first trenches. Wetting of the glue corresponds to the behavior of the glue in contact with the upper face of the wall. We talk about total wetting when the glue spreads over the upper face and about partial wetting when the glue forms a drop over this upper face. In particular, wetting of the glue may be determined by the characteristics of the glue such as the surface tension of the glue or the contact angle of the glue over the upper face of the wall. A person skilled in the art would know how to select a suitable value for the surface tension and/or the contact angle according to the considered application.

That being so, for indication, the glue typically has a contact angle (also referred to as “wetting angle”) that is large enough, for example a contact angle larger than 30°, to contribute in preventing a spill-out thereof, in particular after the deposition of the glue over the wall or after attachment of the sealing structures over the wall. Moreover, the formation of the second trenches thinner than the first trenches allows ensuring a final cutting (i.e., cutting of the wall and of the support substrate in the cutting areas in order to individualize the packages) which does not peel off the glue.

Consequently, the method according to this aspect allows performing cuts on relatively thin walls without producing defects such as peeled off glue so as to manufacture several compact packages featuring no traces of these defects.

According to one implementation, the first trenches have a first width, the second trenches have a second width and the difference between the first width and the second width is larger than or equal to 100 μm.

Such a difference between the first width and the second width allows avoiding, during the formation of the second trenches, a cutting of the wall that is too close to the edges of the first trenches and guaranteeing as much as possible that the glue located on either side of the first trenches is not peeled off during the formation of the second trenches.

In some cases, the first trenches may have a curved bottom so that the curved shape of the bottom of the trenches could extend up to the edges of the first trenches which then are no longer quite abrupt to prevent the glue from spilling out into the first trenches.

Hence, it is particularly advantageous that the first trenches are deep enough so as to have abrupt edges.

Thus, in this respect and according to one implementation, the depth of the first trenches is comprised between 50% and 80% of the height of the wall.

According to another aspect, an integrated circuit package comprises: a support substrate having a mounting face; a lateral wall disposed over the mounting face, having an inner face and an outer face, the inner face delimiting with the mounting face a cavity, the outer face including a step extending outwardly of the package; an electronic integrated circuit chip disposed in the cavity above the mounting face of the support substrate and electrically connected to electrically-conductive contact pads located over the mounting face; a sealing structure, bonded by an adhesive (such as a glue), over an upper face of the lateral wall and sealing the cavity, said adhesive (glue) not spilling out over the outer face of the lateral wall; and electrically-conductive connection elements located over a lower face of the support substrate and electrically cooperating with said contact pads through an interconnection network located in the support substrate.

According to one embodiment, the contact angle of the glue over the upper face of the wall is larger than 30°.

According to one embodiment, the step is located at a distance from the upper face of the lateral wall and has a width larger than or equal to 100 μm.

According to one embodiment, the distance is comprised between 50% and 80% of the height of the lateral wall.

BRIEF DESCRIPTION OF THE DRAWINGS

Other advantages and features of the invention will appear upon examining the detailed description of non-limiting embodiments and implementations, and from the appended drawings, wherein.

DETAILED DESCRIPTION

FIGS. 1-5 illustrate steps in a method of manufacture. FIG. 6 illustrates the package produced by the method of manufacture.

Figure 1:
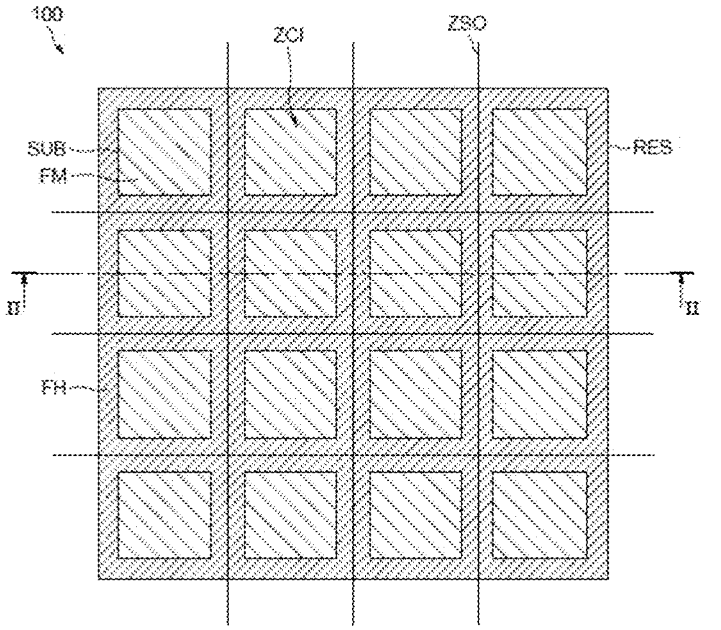
FIG. 1 illustrates a top view of a support substrate.

FIG. 1 illustrates with a top view a step 100 of providing (or obtaining) a support substrate SUB.

The support substrate SUB has a mounting face FM and comprises a wall RES projecting over the mounting face FM.

The wall is typically made of resin and has an upper face FH at a distance from the mounting face FM of the support substrate SUB.

The formation of a wall using a resin is known per se to a person skilled in the art. The wall RES delimits with the mounting face FM an array of cavities ZCI and is intended in particular to delimit the adjacent cavities ZCI over a row or a column of the array.

The wall RES has cutting areas ZSO, also referred to as cut lines, distributed along the rows and the columns of the array and between the cavities ZCI.

Figure 2:
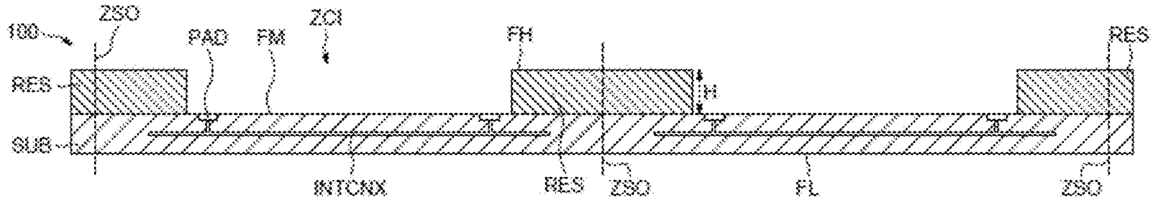
FIG. 2 is a partial sectional view of the support substrate shown in FIG. 1.

FIG. 2 is a partial sectional view according to the line II-II of FIG. 1.

For simplicity, only a few portions of the wall RES are represented.

The wall RES has a height H comprised, for example, between 270 μm and 370 μm.

In this embodiment, each cavity ZCI includes electrically-conductive contact pads PAD over the mounting face FM.

The support substrate SUB comprises a lower face FL opposite to the mounting face FM.

Under each cavity ZCI, the support substrate SUB includes an interconnection network INTCNX, represented in a quite schematic way and with a conventional structure, between the contact pads PAD and contact pads of the lower face FL.

The interconnection network INTCNX comprises conductive tracks, typically made of copper (Cu), integrated into one or more layer(s) of a dielectric material such as resin mixed with glass fiber, of the support substrate SUB.

Consequently, in this embodiment, the support substrate SUB is a laminate plate.

Figure 3:
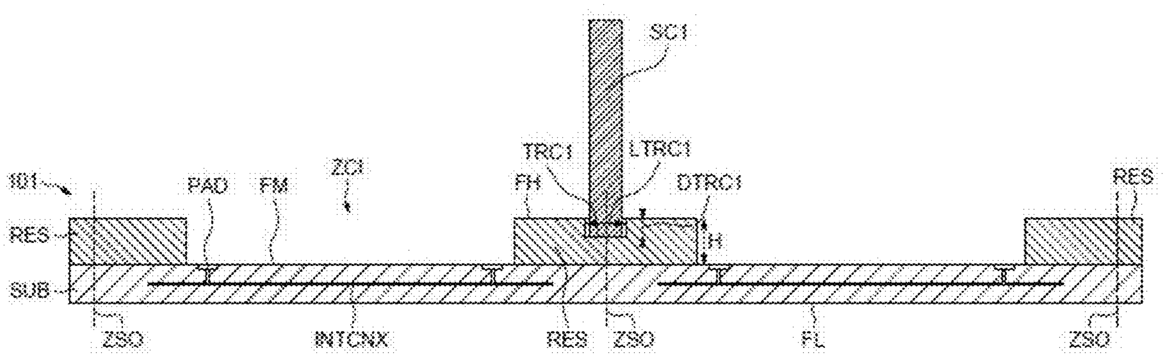
FIG. 3 illustrates a step of forming first trenches in a wall of the support substrate.

FIG. 3 illustrates a step 101 of forming first trenches TRC1 in the wall RES.

The formation of the first trenches TRC1 may comprise a partial cutting of the wall RES according to the cutting areas ZSO, so that the first trenches TRC1 extend, along the cut line, partially in the wall RES around each cavity ZCI.

More particularly, the first trenches TRC1 herein have a depth DTRC1 comprised between 50% and 80% of the height H of the wall RES.

In this embodiment, they have a first width LTRC1 comprised between 350 μm and 450 μm.

Thus, the first trenches TRC1 are deep enough to avoid that the curved shape of the bottom of the trenches extends up to the edges of the first trenches TRC1.

Consequently, the first trenches TRC1 advantageously have relatively abrupt edges.

The wall RES, in which the first trenches TRC1 are respectively formed, then has a “U”-like shape. The “U”- like shape of the wall RES allows defining, over the upper face FH of the wall RES, a surface on each side of the cutting area ZSO between the cavities ZCI.

More particularly, the first trenches TRC1 may be formed, for example, by a cutting blade SC1. However, other cutting means are possible, for example a laser.

Figure 4:
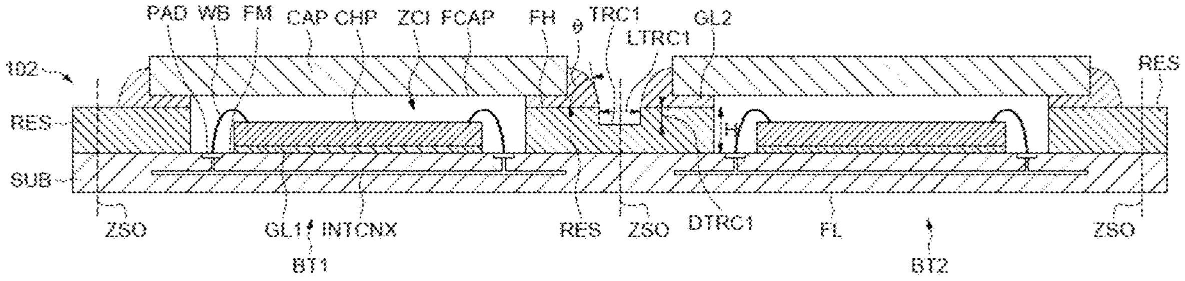
FIG. 4 illustrates a step of assembling packages over the support substrate.

FIG. 4 illustrates a step 102 of assembling packages over the support substrate SUB.

For simplification, only two adjacent packages BT1 and BT2 have been represented.

In particular, the assembly 102 comprises a step of mounting electronic integrated circuit chips CHP over the mounting face FM of the support substrate SUB respectively in the cavities ZCI.

The electronic chips CHP electrically cooperate with the corresponding contact pads PAD in each cavity ZCI.

For example, the electronic chips CHP may be attached on the mounting face FM between the contact pads PAD by an adhesive material such as a glue GL1 and be electrically connected to the contact pads PAD by connecting wires WB.

According to another possible variant, the electronic chips CHP may include solder beads soldered to the contact pads PAD which would then be located beneath the electronic chips CHP.

The solder beads would be embedded in a layer of an underfill material (known to a person skilled in the art as "underfill") allowing mechanically attaching the electronic chips CHP on the mounting face FM.

The electronic chips CHP are then electrically connected to the contact pads PAD through the solder beads.

The assembly 102 also comprises a step of sealing the cavities ZCI by respective sealing structure CAP.

The sealing structure CAP are attached on the wall RES between the first trenches TRC1 so as to obtain an array of packages BT1, BT2.

In the case of optical packages, the sealing structure CAP may be an optically-transparent sealing element such as a glass plate, for example.

Furthermore, sealing of each cavity ZCI comprises gluing of the sealing structure CAP over an upper face FH of the wall RES. More particularly, gluing of the sealing structure CAP positioned above the corresponding electronic chip CHP is performed by means of an adhesive material such as a glue GL2 disposed between an end area of the attachment face FCAP of the sealing structure CAP and the upper face FH of the wall RES.

The glue GL2 may consist of relatively soft glue, for example an acrylate-type glue capable of crosslinking when it is exposed to an ultraviolet (UV) radiation and during a thermal annealing. The glue GL2 typically has mechanical properties different from the material of the wall RES, such as the resin.

According to a first possibility, gluing of the sealing structure CAP comprises a step of depositing glue GL2 over the upper face FH of the wall RES, in particular over the surface located on each side of the first trenches TRC1.

The glue GL2 located over the upper face FH of the wall RES typically has a contact angle θ larger than 30°. More particularly, the contact angle θ of the glue GL2 corresponds to the angle formed between the upper face FH of the wall RES and the tangent to the surface of the glue GL2 at the point of contact with the upper face FH. The contact angle θ of the glue GL2 allows achieving a partial wetting of the upper face FH by the glue GL2 and therefore allows minimizing the surface over which the glue GL2 spreads, in particular when the edges of the first trenches TRC1 at the end of this surface are abrupt.

Afterwards, the sealing structure CAP is pressed against the upper face FH of the wall RES, so that the glue GL2 spreads over the upper face FH without spilling out into the first trenches TRC1 and adheres to the attachment face FCAP of the sealing structure CAP.

Alternatively to this first possibility, the glue GL2 may also be deposited over the end area of the fastening face FCAP of the sealing structure CAP so that, when the sealing structure CAP is pressed against the upper face FH of the wall RES, the glue GL2 spreads over the upper face FH, in particular over the surface located on either side of the first trenches TRC1, without spilling out into the first trenches TRC1 and adheres to the upper face FH.

In particular, irrespective of the alternative used, the pressure applied to the sealing structure CAP to press it against the upper face FH is high enough so that the glue GL2 adheres to the fastening face FCAP and to this upper face FH.

Furthermore, this pressure is low enough to avoid the glue GL2 spilling out into the first trenches TRC1, while taking account of the surface tension of the glue GL2 or its contact angle.

This pressure also depends on the counter-pressure inside the cavity and the desired glue thickness.

A person skilled in the art would know how to adjust this pressure according to all these parameters to obtain a suitable adhesion and prevent a spill-out of the glue into the first trenches TRC1.

For example, the pressure applied to the sealing structure CAP is selected so that the thickness of the glue GL2 between the upper face FH and the attachment face FCAP of the sealing structure CAP after attachment of the sealing structure CAP is comprised between 100 μm and 250 μm.

Hence, the glue GL2 typically has a contact angle θ large enough to contribute in preventing a spill-out of the glue GL2, after deposition of the glue GL2 over the wall RES and after attachment of the sealing structure CAP to the wall RES.

The "U"-like shape of the wall RES, as well as the characteristics of the glue GL2, for example the surface tension or the contact angle, allow avoiding the glue GL2 located on either side of the first trenches TRC1 spilling out into the first trenches TRC1, in particular into the cutting areas ZSO in which the final cut is carried out as described later on with reference to FIG. 5.

Thus, it is possible to obtain, after the assembly step 102, integrated circuit packages BT1 and BT2 made over the same support substrate SUB and delimited by the first trenches TRC1 free of glue GL2.

Figure 5:
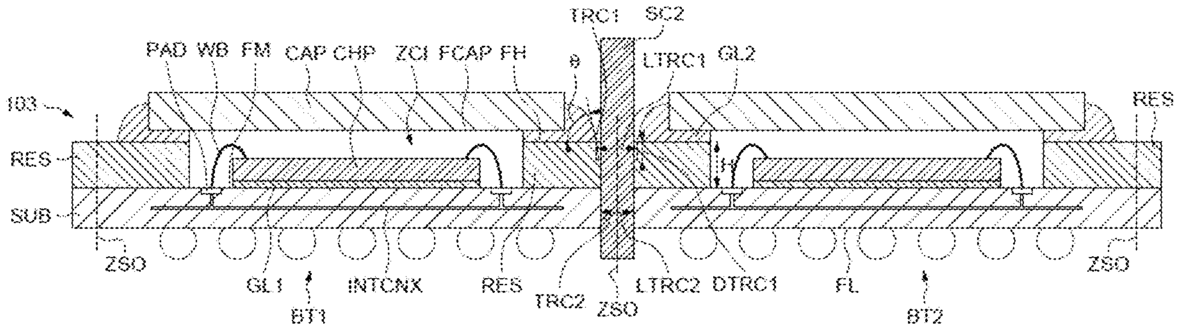
FIG. 5 illustrates a step of forming electrically-conductive connection elements and a step of individualizing the packages.
Figure 6:
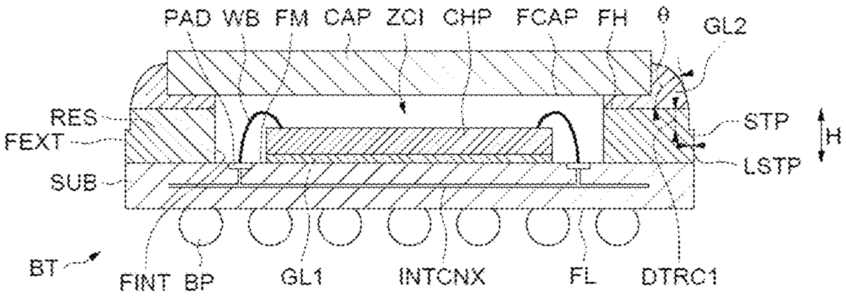
FIG. 6 schematically illustrates a sectional view of an example of a package made using the process illustrated in FIGS. 1-5.

FIG. 5 illustrates a step of forming electrically-conductive connection elements BP and a step 103 of individualizing, also referred to as singulating, the packages BT1 and BT2.

The electrically-conductive connection elements BP, for example solder beads, are formed over the lower face FL of the support substrate SUB, under each cavity ZCI.

The connection elements BP cooperate electrically with the corresponding interconnection network INTCNX through the contact pads located over the lower face FL of the support substrate SUB and, in particular, allow electrically connecting the respective electronic chips CHP to a printed circuit board.

The step 103 of individualizing the packages BT1 and BT2 comprises cutting the wall RES and the support substrate SUB by forming second trenches TRC2 in said wall and the support substrate SUB.

More particularly, the second trenches TRC2 may be formed, for example, by a cutting blade SC2 different from the cutting blade SC1 for example. Herein again, other cutting means may be considered, for example a laser.

Regardless of the used cutting means, the second trenches TRC2 are thinner than the first trenches TRC1 and extend the first trenches TRC1 up to the lower face FL of the support substrate SUB.

In particular, the second trenches TRC2 have a second width LTRC2 comprised between 200 μm and 300 μm.

The formation of the second trenches TRC2 thinner than the first trenches TRC1 allows ensuring a final cut (i.e., cutting of said wall RES and of the support substrate SUB) which does not peel off the glue GL2.

Moreover, the difference LSTP between the first width LTRC1 and the second width LTRC2 is advantageously larger than or equal to 100 μm.

Such a difference between the first width LTRC1 and the second width LTRC2 allows avoiding a cut that is too close to the edges of the first trenches TRC1 and guaranteeing as much as possible that the glue GL2 located on either side of the first trenches TRC1 is not peeled off during the formation of the second trenches TRC2.

Consequently, the method allows as much as possible performing cutting on relatively thin walls RES without producing defects such as peeled off glue GL2 so as to manufacture several compact integrated circuit packages BT1 and BT2 featuring no traces of these defects.

FIG. 6 schematically illustrates a sectional view of an example of a package BT according to an embodiment and for example obtained by the method described before with reference to FIGS. 1 to 5.

The package BT includes a support substrate SUB, an electronic chip CHP and a sealing structure CAP. The support substrate SUB has a mounting face FM and a lower face FL opposite to the mounting face FM.

The package BT further comprises a lateral wall RES disposed over the mounting face FM.

The lateral wall RES has an inner face FINT, an outer face FEXT and an upper face FH at a distance from the mounting face FM.

The inner face FINT delimits with the mounting face FM a cavity ZCI and the outer face FEXT includes a step STP.

The step STP extends outwardly of the package BT and is located at a distance DTRC1 from the upper face FH of the lateral wall RES.

The distance DTRC1 is comprised between 50% and 80% of the height H of the lateral wall RES.

Furthermore, the step STP has a width LSTP larger than or equal to 100 μm.

The electronic chip CHP is disposed in the cavity ZCI above the mounting face FM of the support substrate SUB.

The electronic chip CHP is electrically connected to electrically-conductive contact pads PAD located over the mounting face FM.

In particular, the contact pads PAD are located around the electronic chip CHP which is attached on the mounting face FM by the glue GL1 and which is electrically connected to the contact pads PAD by connecting wires WB.

According to a possible variant, the contact pads PAD may be located beneath the electronic chip CHP. The electronic chip CHP may then include solder beads attached to the contact pads PAD allowing electrically connecting the chip CHP to the contact pads PAD. According to this variant, the solder beads of the electronic chip CHP are embedded in a layer of an underfill material.

The sealing structure CAP is bonded by means of a glue GL2 over the upper face FH of the lateral wall RES and seals the cavity ZCI.

The sealing structure CAP may be a transparent sealing structure such as a glass in the case of an optical package.

In particular, the sealing structure CAP includes an attachment face FCAP having an end area bonded over the upper face FH of the lateral wall RES, by the glue GL2.

The glue GL2 located over the upper face FH of the wall RES, typically has a contact angle θ larger than 30° and does not spill out over the outer face FEXT of the lateral wall RES.

Moreover, the integrated circuit package BT includes electrically-conductive connection elements BP, such as solder beads. The connection elements BP are located over the lower face FL of the support substrate SUB and are electrically cooperating with the contact pads PAD through an interconnection network INTCNX located in the support substrate SUB.

The invention claimed is:

1. A method for manufacturing integrated circuit packages, comprising:
   - providing a support substrate having a mounting face and comprising a wall projecting over the mounting face, said wall delimiting with the mounting face an array of cavities, the mounting face at each cavity including electrically-conductive contact pads, the support substrate including under each cavity an interconnection network between the electrically-conductive contact pads and a lower face of the support substrate;
   - forming first trenches extending partially through a thickness of the wall around each cavity;
   - mounting an electronic integrated circuit chip on the mounting face of the support substrate respectively in each cavity and electrically cooperating with corresponding electrically-conductive contact pads;
   - sealing each cavity by gluing a respective sealing structure over an upper face of the wall using an adhesive configured to not spill out into the first trenches, so as to obtain an array of packages;
   - forming electrically-conductive connection elements under each cavity electrically cooperating with the corresponding interconnection network; and
   - individualizing the array of packages by cutting said wall and the support substrate to form, in said wall and in the support substrate, second trenches that are thinner than the first trenches and which extend the first trenches through to the lower face of the support substrate.

2. The method according to claim 1, wherein a contact angle of the adhesive over the upper face of the wall is larger than 30°.

3. The method according to claim 1, wherein the first trenches have a first width, the second trenches have a second width and a difference between the first width and the second width is larger than or equal to 100 μm.

4. The method according to claim 1, wherein a depth of the first trenches is between 50% and 80% of the thickness of the wall.

5. The method according to claim 1, wherein the sealing structure is optically transparent.

6. The method according to claim 5, wherein the optically transparent sealing structure is a glass plate.

7. A method for manufacturing an integrated circuit package, comprising:
   - forming a wall over a mounting face of a support substrate, wherein the wall delimits with the mounting face a cavity;
   - forming a first trench extending through a partial thickness of the wall and extending around the cavity;

mounting an electronic integrated circuit chip to the mounting face of the support substrate in the cavity;

mounting a sealing structure to an upper face of the wall, wherein the sealing structure seals the cavity, and wherein the sealing structure is mounted using an adhesive, wherein the adhesive is configured to not spill out into the first trench; and cutting the wall and the support substrate at location of the first trench to form, in said wall and in the support substrate, a second trench extending through a remaining thickness of the wall at the first trench and through a thickness of the support substrate to a lower face of the support substrate.

8. The method according to claim 7, wherein the first trench has a first width and the second trench has a second width that is smaller than the first width.

9. The method according to claim 8, wherein a difference between the first width and the second width is larger than or equal to 100 μm.

10. The method according to claim 7, wherein the sealing structure is optically transparent.

11. The method according to claim 10, wherein the optically transparent sealing structure is a glass plate.

12. The method according to claim 7, further comprising forming electrically-conductive connection elements on the lower face of the support substrate under the cavity.

13. The method according to claim 12, further comprising electrically connecting the electrically-conductive connection elements to the electronic integrated circuit chip using an interconnection network within the support substrate.

14. The method according to claim 7, wherein a contact angle of the adhesive over the upper face of the wall is larger than 30°.

15. The method according to claim 7, wherein a depth of the first trench is between 50% and 80% of the thickness of the wall.

* * * * *